US008310298B2

United States Patent
(12) United States Patent
Baumgartner et al.

(10) Patent No.: US 8,310,298 B2
(45) Date of Patent: Nov. 13, 2012

(54) RATIOED FEEDBACK BODY VOLTAGE BIAS GENERATOR

(75) Inventors: Steven J. Baumgartner, Zumbro Falls, MN (US); Patrick L. Rosno, Rochester, MN (US); Dana M. Woeste, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 1057 days.

(21) Appl. No.: 11/866,110

(22) Filed: Oct. 2, 2007

(65) Prior Publication Data

US 2008/0072181 A1 Mar. 20, 2008

Related U.S. Application Data

(63) Continuation-in-part of application No. 11/533,408, filed on Sep. 20, 2006, now Pat. No. 7,474,144.

(51) Int. Cl.
*G05F 1/575* (2006.01)

(52) U.S. Cl. ........ 327/534; 327/537; 327/541; 327/543; 323/315

(58) Field of Classification Search ........................ None
See application file for complete search history.

(56) References Cited

U.S. PATENT DOCUMENTS

| | | | | |
|---|---|---|---|---|
| 6,670,655 | B2 | 12/2003 | Lukes et al. | |
| 6,759,875 | B2 * | 7/2004 | Mano et al. | 326/95 |
| 7,698,525 | B2 * | 4/2010 | Kumar | 711/170 |
| 2003/0030474 | A1 * | 2/2003 | McGowan | 327/202 |
| 2006/0192611 | A1 * | 8/2006 | Bonaccio et al. | 327/543 |

* cited by examiner

*Primary Examiner* — Lincoln Donovan
*Assistant Examiner* — Terry L Englund
(74) *Attorney, Agent, or Firm* — Bockhop & Associates LLC

(57) ABSTRACT

A design structure embodied in a machine readable medium used in a design process includes a current mirror circuit that includes a reference current source that generates a reference current, a reference transistor, a mirror transistor and a ratioed body bias feedback unit. The reference transistor has a first node that is coupled to the output of the reference current source, a gate that is coupled to the first node and a second node coupled to a common voltage. The mirror transistor has a gate coupled to the first node. The ratioed body bias feedback unit generates a body bias voltage coupled to the body of the reference transistor and the body of the mirror transistor. The ratioed body bias feedback unit is configured to adjust the body bias voltage in relationship to the common voltage so that the reference transistor and the mirror transistor each have a threshold voltage within a predefined range.

18 Claims, 2 Drawing Sheets

100
$V_{dd}$
10
$V_{ref}$
$i_{ref}$
16
CIRCUIT LOAD
110
vd
nbias
BODY BIAS
bbias
gd
nbias
14
12
$V_{gg}$ 300
330
320
340
380
310
350
370
360
385
390
395

RATIOED FEEDBACK BODY VOLTAGE BIAS GENERATOR

CROSS-REFERENCE TO RELATED APPLICATION(S)

This application is a continuation-in-part of, and claims the benefit of, U.S. patent application Ser. No. 11/533,408, filed Sep. 20, 2006 the entirety of which is hereby incorporated herein by reference.

BACKGROUND OF THE INVENTION

1. Field of the Invention

The present invention relates to electronic circuits and, more specifically, to a design structure on which a current mirror circuit resides.

2. Description of the Prior Art

In electronic semiconductors, silicon-on-insulator (SOI) structures are used for isolating complementary MOS (CMOS) transistors from a substrate. An SOI structure employs a layer of insulating material (such as a silicon dioxide layer) close to the surface of a silicon substrate, thereby isolating a layer of substrate silicon from the main substrate body below. A CMOS transistor can then be fabricated on the isolated substrate silicon layer above the insulating layer. Since the area for fabricating the CMOS transistor is isolated from the substrate main body, certain conventional latch-up paths will be excluded. For example, conventional latch-up paths such as "source terminal to the substrate" and "well region to the substrate" no longer exist due to the isolation provided by this insulating layer. SOI CMOS devices often operate at higher speeds than do bulk CMOS devices.

Many electronic circuits, such as digital logic circuits, employ silicon-on-insulator (SOI) technology. SOI technology can be used to increase integrated circuit speed while reducing power consumption. However, maintaining an acceptable body contact resistance in SOI field effect transistor (FET) devices can raise the device threshold voltage (Vth) in such devices. A raised device threshold voltage Vth can cause supply voltage headroom problems.

A current mirror is a circuit in which a reference current from a current source is replicated for use by other circuit elements. As shown in FIG. 1, existing current mirrors employ a reference transistor 12 to draw a reference current ($i_{ref}$) from a current source 10. There is typically a voltage drop ($v_{ref}$) across the current source 10, which gives rise to a reference voltage (nbias) that is used to bias the gate of the reference transistor 12. The reference voltage is also used to bias the gates of subsequent transistors 14 that then draw a current corresponding to the current flowing through the reference transistor 12. Thus, each subsequent transistor 14 regulates the current flowing through a circuit load 16 so as to correspond to the reference current ($i_{ref}$).

A common problem in low supply voltage current mirror designs (e.g., designs embodied with SOI technology) is acquiring enough current source headroom. This necessitates the need to reduce the threshold voltage of the current source device and hence the gate-to-source voltage (Vgs) of the device for increased current source headroom. One method of accomplishing this is to tie the gate of the current mirror to its body. However, this often leads problems in avoiding excessive body forward biasing which results in increased body forward bias current and hence incorrect current mirroring. To ensure both adequate headroom and correct current mirroring, the mirror current should be mainly a function of Vgs and not of the resultant bipolar current of the device as the body bias and Vds become large.

Therefore, there is a need for a low voltage current mirror device that maintains adequate current source headroom.

SUMMARY OF THE INVENTION

The disadvantages of the prior art are overcome by the present invention which, in one aspect, is a current mirror circuit that includes a reference current source, a reference transistor, at least one mirror transistor and a ratioed body bias feedback unit. The reference current source has an output that generates a reference current. The reference transistor has a first node having a first node voltage that is coupled to the output of the reference current source, a gate that is coupled to the first node, a second node coupled to a common voltage and a body. Each mirror transistor has a gate coupled to the first node, a source, a drain and a body. The ratioed body bias feedback unit is responsive to the first node voltage and generates a body bias voltage coupled to the body of the reference transistor and the body of the mirror transistor. The ratioed body bias feedback unit is configured to adjust the body bias voltage in relationship to the common voltage so that the reference transistor and the mirror transistor each have a threshold voltage within a predefined range.

In another aspect, the invention is a ratioed body bias feedback unit for biasing bodies of transistors employed in a current mirror circuit that includes a reference transistor drawing a reference current and having a reference transistor gate and a reference transistor body, and at least one mirror transistor, having a mirror transistor body and a mirror transistor gate that is coupled to the reference transistor gate. The ratioed body bias feedback unit includes a gate bias input that is electrically coupled to the reference transistor gate and a feedback circuit that is responsive to the gate bias input. The feedback circuit generates a body bias voltage that biases the reference transistor body and the reference transistor body so that both the reference transistor and the mirror transistor each have a threshold voltage maintained within a predefined range.

In another aspect, the invention is a method of generating a ratioed body biasing voltage for biasing at least one reference transistor body in a current mirror circuit. The current mirror circuit is a circuit in which a reference voltage is applied to a gate of the reference transistor, having a reference transistor body, and to a gate of at least one mirror transistor, having a mirror transistor body, so as to replicate a reference current drawn by the reference transistor. In the method, the reference voltage is sensed and a body bias voltage is generated. The body bias voltage biases the reference transistor body and the mirror transistor body so as to maintain the reference transistor threshold voltage and the mirror transistor threshold voltage within a predetermined range.

In yet another aspect, the invention is a design structure embodied in a machine readable medium used in a design process. The design structure includes a current mirror circuit that includes a reference current source, a reference transistor, at least one mirror transistor and a ratioed body bias feedback unit. The reference current source has an output that generates a reference current. The reference transistor has a first node having a first node voltage that is coupled to the output of the reference current source, a gate that is coupled to the first node, a second node coupled to a common voltage and a body. Each mirror transistor has a gate coupled to the first node, a source, a drain and a body. The ratioed body bias feedback unit is responsive to the first node voltage and generates a body bias voltage coupled to the body of the reference transistor and the body of the mirror transistor. The ratioed body bias feedback unit is configured to adjust the body bias voltage in relationship to the common voltage so that the reference transistor and the mirror transistor each have a threshold voltage within a predefined range.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
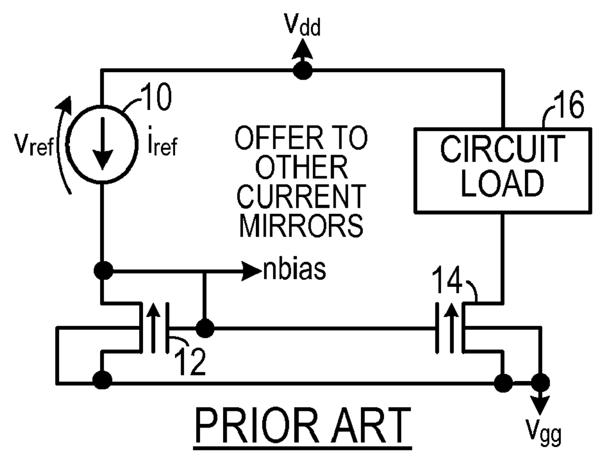
FIG. 1 is a schematic diagram of a prior art current mirror.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2:
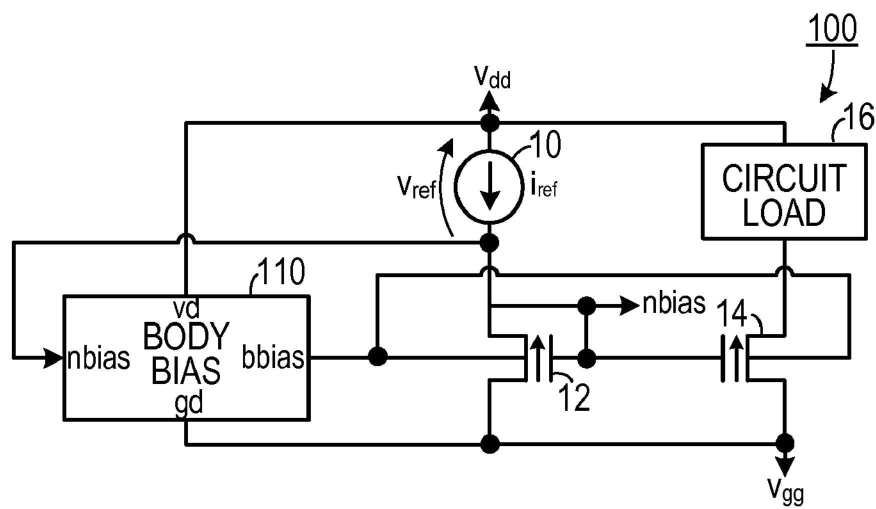
FIG. 2 is a schematic diagram of a current mirror employing a body bias generator.

As shown in FIG. 2, one embodiment of a current mirror circuit 100 employs a reference transistor 12 to draw a reference current ($i_{ref}$) from a current source 10. There is a voltage drop ($v_{ref}$) across the current source 10. The reference voltage (nbias) at the gate of the reference transistor 12 is used to bias the gates of subsequent transistors 14 (only one of which is shown in this example for the sake of clarity) that then draw a current corresponding to the current flowing through the reference transistor 12. Each subsequent transistor 14 regulates the current flowing through a circuit load 16 so as to correspond to the reference current ($i_{ref}$).

A ratioed body bias feedback unit 110 is responsive to the reference voltage (nbias) and generates a body bias voltage (bbias) that is coupled to the body of the reference transistor 12 and the body of each mirror transistor 14. The ratioed body bias feedback unit 110 is configured to adjust the body bias voltage in relationship to the common voltage (e.g. $V_{gg}$ in the example shown) so that the reference transistor 12 and the mirror transistor 14 each have a threshold voltage within a predefined range. The ratioed body bias feedback unit 110 senses the reference voltage (nbias) and generates a body bias voltage (bbias) that biases the reference transistor 12 body and the mirror transistor 14 body so as to maintain the threshold voltage of the reference transistor 12 and each mirror transistor 14 within a predetermined range.

Figure 3:
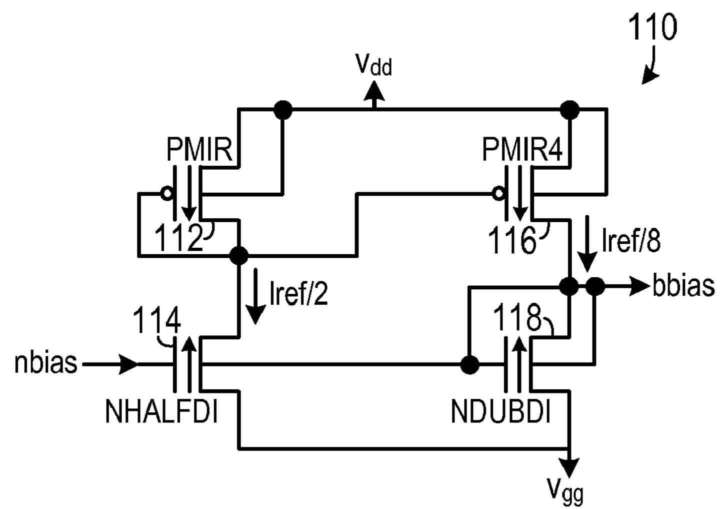
FIG. 3 is a schematic diagram a body bias generator.

As shown in FIG. 3, one embodiment of the ratioed body bias feedback unit 110 electrically couples the gate bias input voltage (nbias) at the source of the reference transistor 12 (shown in FIG. 2) to the gate of a first n-type transistor 114. The first n-type transistor 114 has a drain coupled to a common voltage ($V_{gg}$), a source, a body, and a gate that is coupled to the gate of the reference transistor 12 (shown in FIG. 2). A first p-type transistor 112 has a source coupled to a voltage Supply ($V_{dd}$), a drain coupled to the source of the first n-type transistor 114, a body coupled to the voltage supply ($V_{dd}$) and a gate coupled to the source of the first n-type transistor 114. A second n-type transistor 118 has a drain coupled to the common voltage ($V_{gg}$), a source coupled to the body of the first n-type transistor 114, a body coupled to the body of the first n-type transistor 114 and a gate coupled to the body of the first n-type transistor 114. A second p-type transistor 116 has a drain coupled to the body of the first n-type transistor 114, a source coupled to the voltage supply ($V_{dd}$), a body coupled to the voltage supply ($V_{dd}$) and a gate coupled to the source of the first n-type transistor 114.

In the embodiment shown, the first p-type transistor (also referred to as "PMIR") 112 and the first n-type transistor (also referred to as "NHALFDI") 114 each have a size selected so that the first n-type transistor 114 draws a current (Iref/2) that is a first fraction (one-half in the embodiment shown) of the reference current (Iref in FIG. 2). The second p-type transistor (also referred to as "PMIR4") 116 and the second n-type transistor (also referred to as "NDUBDI") 118 each have a size so that the second n-type transistor 118 draws a current (Iref/8) that is a second fraction (one-eighth in the embodiment shown), less than the first fraction, of the reference current. Because the current drawn by the second n-type transistor 118 is a fraction of the current drawn by the first n-type transistor 114, the ratioed body bias feedback unit 110 is inherently stable and the body bias voltage (bbias) always closes on the reference voltage (nbias). It should be noted that the relative proportions for the fractional currents given for (Iref/2) and (Iref/8) are exemplary only: other proportions could be used and still achieve workable results—so long as the second n-type transistor 118 is configured to draw a current that is a fraction of the current drawn by the first n-type transistor 114, the body bias feedback unit 110 will be a stable feedback system.

Figure 4:
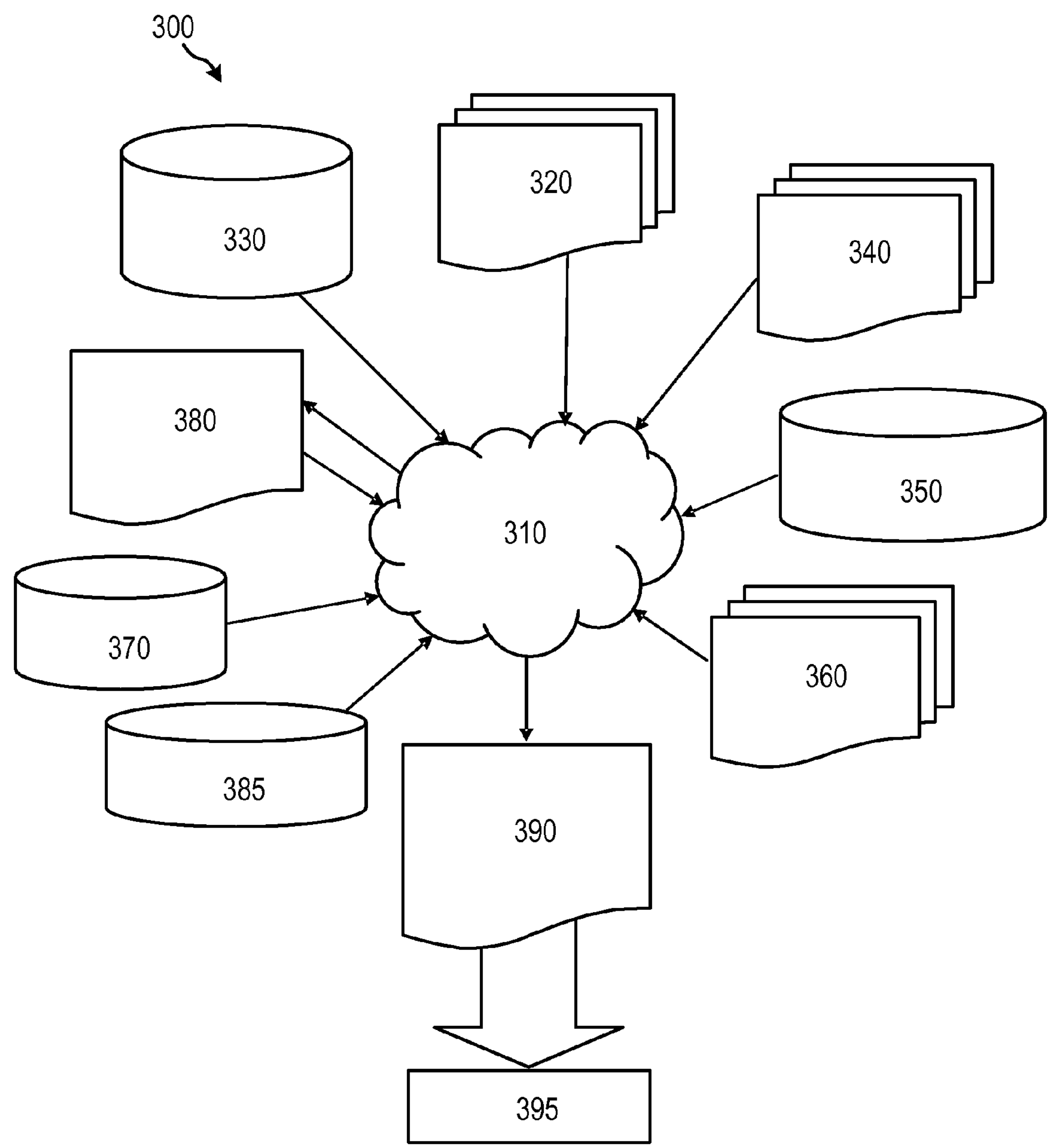
FIG. 4 is a flow diagram of a design process used in semiconductor design, manufacturing, and/or test of the embodiments disclosed herein.

FIG. 4 shows a block diagram of an example design flow 300. Design flow 300 may vary depending on the type of IC being designed. For example, a design flow 300 for building an application specific IC (ASIC) may differ from a design flow 300 for designing a standard component. Design structure 320 is preferably an input to a design process 310 and may come from an IP provider, a core developer, or other design company or may be generated by the operator of the design flow, or from other sources. Design structure 320 comprises circuit 100 (shown in FIG. 2) in the form of schematics or HDL, a hardware-description language (e.g., Verilog, VHDL, C, etc.). Design structure 320 may be contained on one or more machine readable medium. For example, design structure 320 may be a text file or a graphical representation of circuit 100. Design process 310 preferably synthesizes (or translates) circuit 100 into a netlist 380, where netlist 380 is, for example, a list of wires, transistors, logic gates, control circuits, I/O, models, etc. that describes the connections to other elements and circuits in an integrated circuit design and recorded on at least one of machine readable medium. This may be an iterative process in which netlist 380 is resynthesized one or more times depending on design specifications and parameters for the circuit.

Design process 310 may include using a variety of inputs; for example, inputs from library elements 330 which may house a set of commonly used elements, circuits, and devices, including models, layouts, and symbolic representations, for a given manufacturing technology (e.g., different technology nodes, 32 nm, 45 nm, 90 nm, etc.), design specifications 340, characterization data 350, verification data 360, design rules 370, and test data files 385 (which may include test patterns and other testing information). Design process 310 may further include, for example, standard circuit design processes such as timing analysis, verification, design rule checking, place and route operations, etc. One of ordinary skill in the art of integrated circuit design can appreciate the extent of possible electronic design automation tools and applications used in design process 310 without deviating from the scope and spirit of the invention. The design structure of the invention is not limited to any specific design flow.

Design process 310 preferably translates an embodiment of the invention as shown in FIG. 2, along with any additional integrated circuit design or data (if applicable), into a second design structure 390. Design structure 390 resides on a storage medium in a data format used for the exchange of layout data of integrated circuits (e.g., information stored in a GDSII (GDS2), GL1, OASIS, or any other suitable format for storing such design structures). Design structure 390 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 2. Design structure 390 may then proceed to a stage 395 where, for example, design structure 390: proceeds to tape-out, is released to manufacturing, is released to a mask house, is sent to another design house, is sent back to the customer, etc.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A design structure embodied in a machine readable medium used in a design process, the design structure comprising a non-transitory computer readable storage medium that stores therein a current mirror circuit, that includes:

a. a reference current source, having an output, that generates a reference current;

b. a reference transistor, having a first node having a first node voltage that is coupled to the output of the reference current source, a gate that is coupled to the first node, a second node coupled to a common voltage, and a body;

c. at least one mirror transistor, having a gate coupled to the first node, a source, a drain and a body; and d. a ratioed body bias feedback unit, directly responsive to the first node voltage, that generates a body bias voltage coupled to the body of the reference transistor and the body of the at least one mirror transistor, the ratioed body bias feedback unit configured to adjust the body bias voltage in relationship to the common voltage so that the reference transistor and the at least one mirror transistor each have a threshold voltage within a predefined range.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1, wherein the ratioed body bias feedback unit comprises:

a. a gate bias input that is electrically coupled to the first node; and b. a feedback circuit that is responsive to the gate bias input and that generates the body bias voltage.

6. The design structure of claim 5, wherein the feedback circuit comprises:

a. a first n-type transistor having a drain coupled to the common voltage, a source, a body, and a gate that is coupled to the reference transistor gate;

b. a first p-type transistor having a source coupled to a voltage supply, a drain coupled to the source of the first n-type transistor, a body coupled to the voltage supply and a gate coupled to the source of the first n-type transistor;

c. a second n-type transistor having a drain coupled to the common voltage, a source coupled to the body of the first n-type transistor, a body coupled to the body of the first n-type transistor and a gate coupled to the body of the first n-type transistor; and d. a second p-type transistor having a drain coupled to the body of the first n-type transistor, a source coupled to the voltage supply, a body coupled to the voltage supply and a gate coupled to the source of the first n-type transistor.

7. The design structure of claim 6, wherein the first p-type transistor and the first n-type transistor each have a size selected so that the first n-type transistor draws a current that is a first fraction of the reference current and wherein the second p-type transistor and the second n-type transistor each have a size so that the second n-type transistor draws a current that is a second fraction, less than the first fraction, of the reference current.

8. The design structure of claim 7, wherein the first fraction is such that the first n-type transistor draws one-half of the reference current.

9. The design structure of claim 7, wherein the second fraction is such that the second n-type transistor draws one-eighth of the reference current.

10. A design structure embodied in a non-transitory machine readable medium for designing, manufacturing, or testing a design, comprising:

a non-transitory computer readable storage medium that stores the design structure comprising a current mirror circuit, the design structure including:

a. a reference current source, having an output, that generates a reference current;

b. a reference transistor, having a first node having a first node voltage that is coupled to the output of the reference current source, a gate that is coupled to the first node, a second node coupled to a common voltage, and a body;

c. at least one mirror transistor, having a gate coupled to the first node, a source, a drain and a body; and d. a ratioed body bias feedback unit, directly responsive to the first node voltage, that generates a body bias voltage coupled to the body of the reference transistor and the body of the at least one mirror transistor, the ratioed body bias feedback unit configured to adjust the body bias voltage in relationship to the common voltage so that the reference transistor and the at least one mirror transistor each have a threshold voltage within a predefined range.

11. The design structure of claim 10, wherein the design structure comprises a netlist, which describes the circuit.

12. The design structure of claim 10, wherein the design structure resides on storage medium as a data format used for the exchange of layout data of integrated circuits.

13. The design structure of claim 10, wherein the design structure includes at least one of test data files, characterization data, verification data, or design specifications.

14. The design structure of claim 10, wherein the ratioed body bias feedback unit comprises:

a. a gate bias input that is electrically coupled to the first node; and b. a feedback circuit that is responsive to the gate bias input and that generates the body bias voltage.

15. The design structure of claim 14, wherein the feedback circuit comprises:

a. a first n-type transistor having a drain coupled to the common voltage, a source, a body, and a gate that is coupled to the reference transistor gate;

b. a first p-type transistor having a source coupled to a voltage supply, a drain coupled to the source of the first n-type transistor, a body coupled to the voltage supply and a gate coupled to the source of the first n-type transistor;

c. a second n-type transistor having a drain coupled to the common voltage, a source coupled to the body of the first n-type transistor, a body coupled to the body of the first n-type transistor and a gate coupled to the body of the first n-type transistor; and d. a second p-type transistor having a drain coupled to the body of the first n-type transistor, a source coupled to the voltage supply, a body coupled to the voltage supply and a gate coupled to the source of the first n-type transistor.

16. The design structure of claim 15, wherein the first p-type transistor and the first n-type transistor each have a size selected so that the first n-type transistor draws a current that is a first fraction of the reference current and wherein the second p-type transistor and the second n-type transistor each have a size so that the second n-type transistor draws a current that is a second fraction, less than the first fraction, of the reference current.

17. The design structure of claim 16, wherein the first fraction is such that the first n-type transistor draws one-half of the reference current.

18. The design structure of claim 16, wherein the second fraction is such that the second n-type transistor draws one-eighth of the reference current.

* * * * *